United States Patent
Beck

(10) Patent No.: US 10,338,107 B1
(45) Date of Patent: Jul. 2, 2019

(54) SYSTEM AND METHOD FOR DETECTING A CONTACT BETWEEN AN AERIAL DEVICE AND AN ELECTRICAL POWER SOURCE

(71) Applicant: Altec Industries, Inc., Birmingham, AL (US)

(72) Inventor: Aaron Beck, Kansas City, MO (US)

(73) Assignee: Altec Industries, Inc., Birmingham, AL (US)

( * ) Notice: Subject to any disclaimer, the term of this patent is extended or adjusted under 35 U.S.C. 154(b) by 0 days.

(21) Appl. No.: 16/053,219

(22) Filed: Aug. 2, 2018

(51) Int. Cl.
| | | |
|---|---|---|
| *G01R 19/155* | (2006.01) | |
| *B66C 15/06* | (2006.01) | |
| *G01R 27/02* | (2006.01) | |
| *G01R 1/067* | (2006.01) | |
| G01R 25/00 | (2006.01) | |
| B66F 11/04 | (2006.01) | |
| G01R 17/02 | (2006.01) | |

(52) U.S. Cl.
CPC .......... *G01R 19/155* (2013.01); *B66C 15/065* (2013.01); *G01R 1/06777* (2013.01); *G01R 27/025* (2013.01); *B66F 11/046* (2013.01); *G01R 17/02* (2013.01); *G01R 25/005* (2013.01)

(58) Field of Classification Search
CPC ................. G01R 19/155; G01R 27/025; G01R 1/06777; G01R 25/005; G01R 17/02
USPC ...................................... 324/149, 234, 76.11
See application file for complete search history.

(56) References Cited

U.S. PATENT DOCUMENTS

| | | | |
|---|---|---|---|
| 3,320,524 A | 5/1967 | Miller | |
| 4,694,930 A * | 9/1987 | Kishi | ................... B66F 11/046 182/2.11 |
| 7,230,431 B2 * | 6/2007 | Mirme | ............... G01N 15/1031 324/123 C |
| 8,725,425 B2 | 5/2014 | Feldkamp et al. | |
| 9,550,475 B1 * | 1/2017 | Walker | .................... B66C 23/78 |
| 2009/0027057 A1 * | 1/2009 | Anderson | ............... H04L 12/10 324/457 |
| 2009/0045816 A1 * | 2/2009 | Robinson | ............... G01R 29/24 324/457 |
| 2017/0181388 A1 * | 6/2017 | Song | .................... A01G 23/043 |

* cited by examiner

*Primary Examiner* — Giovanni Astacio-Oquendo
(74) *Attorney, Agent, or Firm* — Erise IP, P.A.

(57) ABSTRACT

Embodiments of the invention provide for a circuit that detects a contact between a high-voltage power source and an electrically-conductive non-grounded device. A probe may conduct an electric potential from the electrically-conductive device to the circuit. A first leg of the circuit may shift the phase of the electric potential of the first leg relative to a phase of the electric potential of a second leg of the circuit. A voltage indicative of the phase difference of the electric potential between the first leg and the second leg may be measured. The detected voltage may be indicative of the contact between the high-voltage power source and the electrically-conductive device.

20 Claims, 5 Drawing Sheets

SYSTEM AND METHOD FOR DETECTING A CONTACT BETWEEN AN AERIAL DEVICE AND AN ELECTRICAL POWER SOURCE

BACKGROUND

1. Field

Embodiments of the invention are broadly directed to detecting contact with an electrical power source. More specifically embodiments of the invention relate to detecting contact between an aerial device and electrical components of a utility pole assembly.

2. Related Art

Power lines and electrical components that carry electricity to households, business, manufacturing plants, or any other facility that uses electricity need maintenance and replacement. This is typically done using aerial devices that include a boom and utility platform that lifts workers to the power lines and electrically charged components that need maintenance. The aerial devices are typically covered in material that is electrically insulating, or include dielectric material, such that contact with the electrically charged components is at least partially insulated. However, not all components are entirely covered with the insulating material. This leaves areas of the aerial device, that may be electrically conductive, exposed to the high voltage of the power lines and electrically charged components. A contact between the power lines or electrically charged components and the utility pole assembly and the aerial device may cause damage to aerial device.

Many times, when a contact occurs it is not reported by the utility workers and the aerial device that was subject to the contact remains in service and may be structurally compromised. Also, there currently is no good way to know that a contact occurred without reporting. Introducing a voltmeter may compromise the dielectric integrity because the voltage is so high. Further, there is no way of inspecting the aerial device in the event of a contact without removing or damaging the dielectric material. Further still, there is no current method for detailing over time the effect that contacts have on the structure of the aerial device such that a comprehensive system be in place to determine when an aerial device should be inspected or repaired based on a level of contact or a duration of contact.

What is needed is system and method for detecting when a contact has occurred and recording information indicative of the contact. A circuit or series of circuits capable of high-impedance voltage measurements may be employed to detect and measure contacts between aerial devices that are not grounded and electrical power sources such as power lines and associated electrically charged components.

SUMMARY

Embodiments of the invention solve these problems by providing a system and method for detecting a contact between an aerial device and an electrical power source. In particular, in a first embodiment, the invention includes a system for detecting a contact between a boom assembly and an electrical source, the system comprising a circuit electrically connected to the boom assembly, a probe for conducting an electric potential from the boom assembly onto the circuit, wherein the circuit comprises a first leg and a second leg, wherein the first leg is configured to shift a phase of the electric potential on the first leg relative to a phase of the electric potential on the second leg, wherein a phase difference between the electric potential on first leg and the electric potential on second leg induces a voltage on a voltmeter, and wherein the induced voltage is indicative of the contact between the boom assembly and the electrical source.

A second embodiment is directed to a system for detecting a contact between a boom assembly and an electrical source, the system comprising a circuit electrically connected to the boom assembly via a probe, wherein the probe conducts an electric potential from the boom assembly onto the circuit, wherein the circuit comprises a plurality of components for altering a phase of the electrical potential received from the probe, and a sensor for detecting a voltage associated with the altered phase of the electric potential, wherein the detected voltage is indicative of the contact between the boom assembly and the electrical source.

A third embodiment is directed to a method for detecting a contact between a boom assembly and an electrical source, the method comprising the steps of conducting an electric potential from the electric source onto the boom assembly, conducting the electric potential from the boom assembly onto a circuit electrically connected to the boom assembly, wherein the electric potential is conducted onto a first leg and a second leg of the circuit, shifting a phase of the electric potential on the first leg, and detecting a voltage induced by a difference in the phase of the electric potential on the first leg and a phase of the electric potential on the second leg, wherein the detected voltage is indicative of the contact between the boom assembly and the electrical source.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the invention will be apparent from the following detailed description of the embodiments and the accompanying drawing figures.

BRIEF DESCRIPTION OF DRAWINGS

Embodiments of the invention are described in detail below with reference to the attached drawing figures, wherein.

Figure 1A:
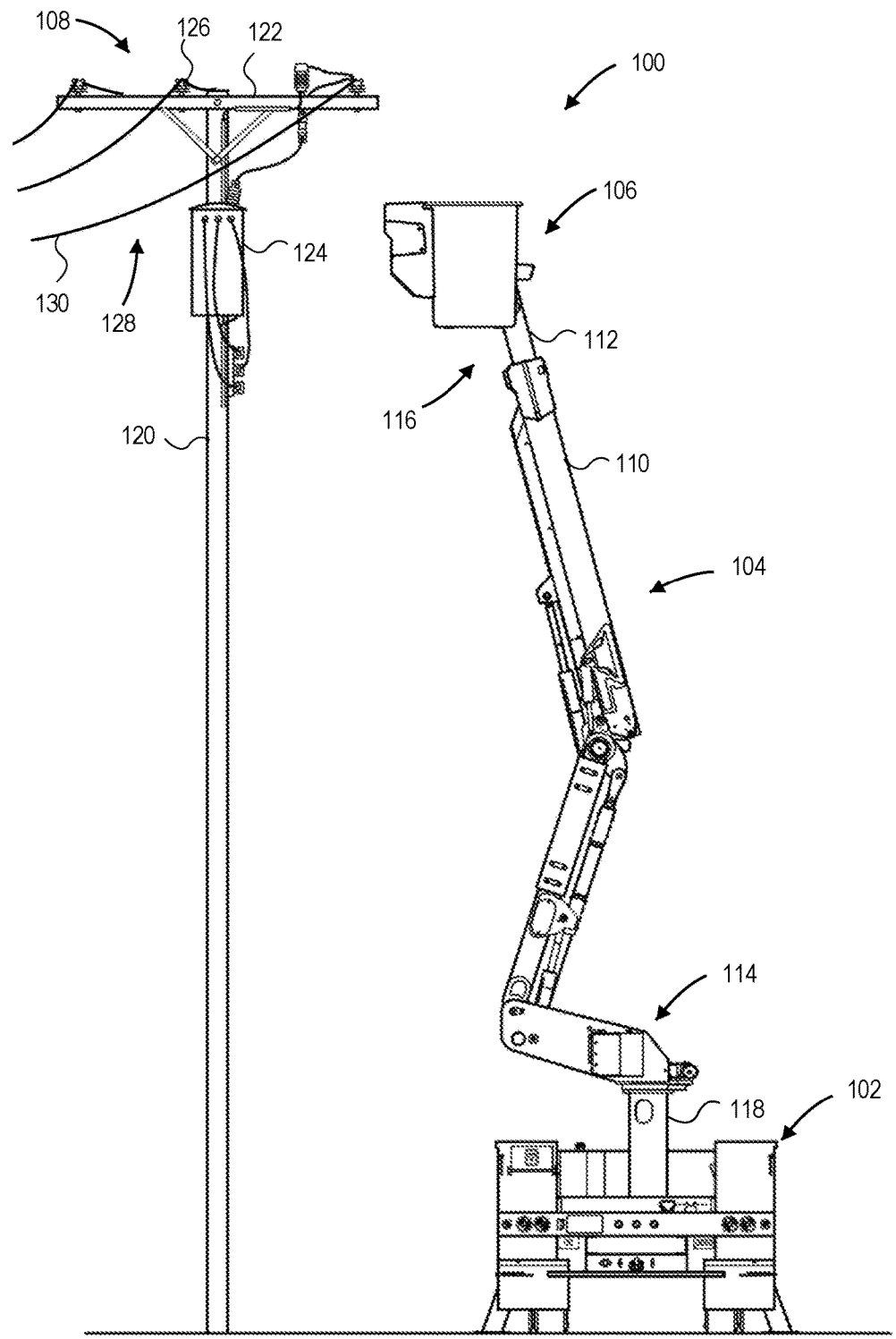
FIG. 1A depicts an exemplary embodiment of an aerial device and a utility pole assembly.

The drawing figures do not limit the invention to the specific embodiments disclosed and described herein. The drawings are not necessarily to scale, emphasis instead being placed upon clearly illustrating the principles of the invention.

DETAILED DESCRIPTION

The following detailed description references the accompanying drawings that illustrate specific embodiments in which the invention can be practiced. The embodiments are intended to describe aspects of the invention in sufficient detail to enable those skilled in the art to practice the invention. Other embodiments can be utilized and changes can be made without departing from the scope of the invention. The following detailed description is, therefore, not to be taken in a limiting sense. The scope of the invention is defined only by the appended claims, along with the full scope of equivalents to which such claims are entitled.

In this description, references to "one embodiment," "an embodiment," or "embodiments" mean that the feature or features being referred to are included in at least one embodiment of the technology. Separate references to "one embodiment," "an embodiment," or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the technology can include a variety of combinations and/or integrations of the embodiments described herein.

Broadly speaking, embodiments of the invention detect a contact between a boom or aerial device and a high-voltage, or high-potential, electrical source. The electrical source as discussed herein is alternating current though in some embodiments may be direct current. A circuit, or combination of circuits, is used to detect the contact without an electrical ground or compromising the dielectric material on the boom and/or aerial device. The circuit may utilize passive components to shift the phase of the very small charges induced by the voltage source on the conductive structure of the boom or aerial device. The circuit may create a difference in phase in different parts of the circuit inducing a voltage on the voltmeter. The measure of the voltage may provide an indication of the contact and may further provide information indicative of the magnitude and duration of the contact.

An aerial device 100, constructed in accordance with various embodiments of the invention, is shown in FIG. 1A. The aerial device 100 generally comprises a structural base 102 with a boom assembly 104 rotatably mounted thereto. A utility platform assembly 106 is disposed on the boom assembly 104 to provide the utility platform assembly 106 for the accomplishment of a task by a utility worker. The aerial device 100 may be controlled to allow a user access to an electrified source such as a utility pole assembly 108 while preventing contact between the aerial device 100 and the utility pole assembly 108. In some embodiments of the invention, a circuit may be electrically connected to or disposed in or on the utility platform assembly 106, the boom assembly 104, or any other part or component of the aerial device 100 for detecting a contact with a highly-charged portion of the utility pole assembly 108.

The structural base 102 of the aerial device 100 is a selectively stabilized platform. In embodiments of the invention, the structural base 102 may be a utility truck (as illustrated in FIG. 1), a crane base, an oilrig, an earth-working machine, or a fixed structure. The structural base 102 provides stability and a counterweight to a load being supported by the boom assembly 104. The structural base 102 also provides a hydraulic power system, pneumatic power system, electrical power system, or other system (not illustrated) that powers the movement of the utility platform assembly 106.

The boom assembly 104 broadly comprises an outer boom section 110 and at least one inner boom section 112. The boom assembly 104 presents a proximal end 114 and a distal end 116. The proximal end 114 is rotatably and/or pivotably secured to a boom turret 118 of the structural base 102. The inner boom section 112 is at least in part disposed within the outer boom section 110. The inner boom section 112 telescopes to extend or retract into the outer boom section 110. Some embodiments of the aerial device may not include the inner boom section 112. All boom operations as well as some structural base operations may be operated by controls disposed in the utility platform assembly 106 or on the structural base 102.

The utility pole assembly 108 as depicted in FIG. 1A may comprise several components. The utility pole assembly 108 may include structural components such as a vertical pole 120 and a cross-member 122. As depicted, electrical components may be mounted on the structural components. A transformer 124 is mounted to the vertical pole 120. Insulators 126 are mounted on the cross-member 122 supporting three-phase power lines 128. In exemplary embodiments described below, the utility platform 106 may come into contact with a phase 130 of the three-phase power lines 128. However, it is possible and included in exemplary embodiments of a contact that any component of the aerial device 100 may contact any combination of the three phases. The three-phase power lines 128 are also exemplary and the three-phase power lines 128 may be single phase or any high-voltage power source.

Figure 1B:
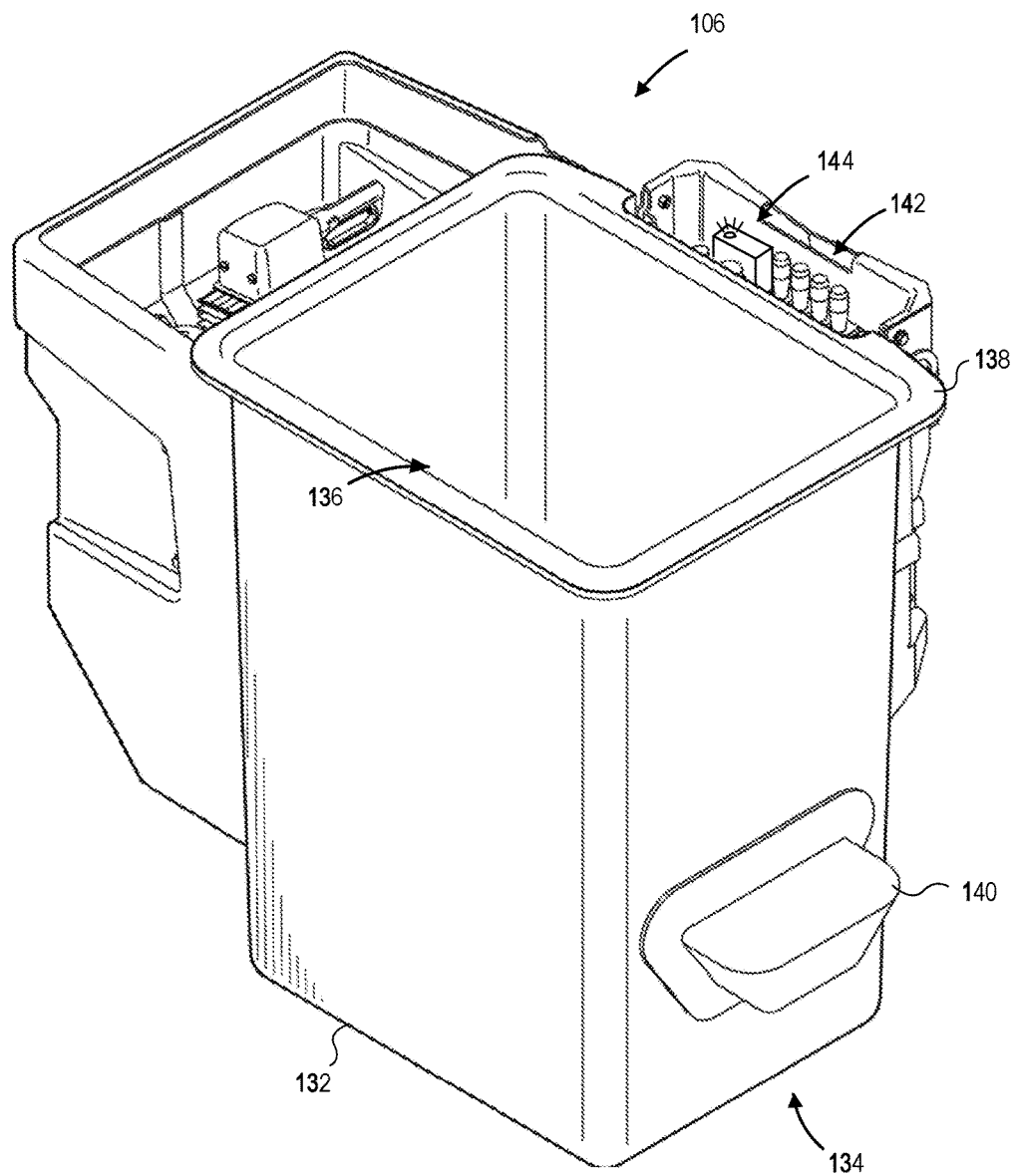
FIG. 1B depicts a perspective view of an embodiment of the utility platform assembly of the aerial device of FIG. 1A.

The utility platform assembly 106, as best illustrated in FIG. 1B, provides an elevated surface from which at least one utility worker can perform a task. Embodiments of the utility platform assembly 106 comprise four platform sidewalls 132 and a platform floor 134 that collectively form a cavity 136. The utility platform assembly 106 may also present a platform lip 138 along a top portion of at least one platform sidewall 132. The utility platform assembly 106 may further comprise a step 140 and/or a door (not illustrated) in at least one of the platform sidewalls 132 to allow for ingress and egress of the utility worker. The utility platform assembly 106 may also comprise a handrail (not illustrated).

The four platform sidewalls 132 and the platform floor 134 of the utility platform assembly 106 form the cavity 136. The four platform sidewalls 132 may be unitary, i.e. formed of a single monolithic structure, or they may be coupled together. The transition between successive platform sidewalls 132, and/or between the platform sidewalls 132 and the platform floor 134, may be rounded or arcuate. In some embodiments, the utility platform assembly 106 presents a horizontal cross-section that is substantially rectangular. Thus, two of the opposing platform sidewalls 132 may have a greater width than the other two opposing platform sidewalls 132. In other embodiments, the utility platform assembly 106 presents a horizontal cross-section that is substantially square. Other embodiments of the utility platform assembly 106 may be other shapes about the horizontal cross-section, such as an ellipse, a circle, a D-shape, a triangle, a trapezoid, a rhombus, or other quadrilateral. The shape of the cross-section of the platform may vary along the height of the platform and the platform shape may be optimized to perform a given function. The platform may be designed for one or multiple workers. The workers may be separated by a structure for safety or may be contained within the same cavity 136, as depicted in FIG. 1B.

In embodiments of the invention, the utility platform assembly 106 further comprises a set of upper boom controls 142, as best illustrated in FIG. 1B. The set of upper boom controls 142 are configured to be manipulated by the operator standing in the utility platform assembly 106 so as to move the utility platform assembly 106 and/or the boom assembly 104 to a desired location and configuration. In some embodiments, the set of upper boom controls 142 utilize hydraulic power that is supplied in the form of a hydraulic fluid by a set of hydraulic lines (not illustrated).

In some embodiments, the utility platform assembly 106 also includes a sensor 144. Sensor 144 either is, or is in communication with, a contact detecting circuit. Sensor 144 includes an indicator for alerting any workers in the utility platform 106 that a contact has occurred. The indicator may be a light, as depicted in FIG. 1B, or may be audible or tactile.

The set of upper boom controls 142 allows the operator to move the boom assembly 104 from within the utility platform assembly 106. The operator in the platform has a better vantage point to know where and how to position the boom assembly 104 as opposed to the operator on the ground to better avoid contact with the utility pole assembly 108. Additionally, the set of upper boom controls 142 promotes efficiency by allowing the operator to directly control the movement of the boom assembly 104. In embodiments of the invention, an assistant operator (not illustrated) can access a set of lower boom controls (not illustrated) for the duration of the operator being in the utility platform assembly 106. This provides a backup to allow the assistant operator to remove the operator from a situation should the operator become incapacitated or there be a failure in the set of upper boom controls 142. The set of upper boom controls 142 may utilize the same or a different mechanism from the set of lower boom controls.

In some embodiments, the boom assembly 104 and the utility platform assembly 106 comprise a dielectric material coat or other insulative material that electrically insulates the components from high-voltage power sources such as the components of the utility pole assembly 108. The material may coat or cover any of the aerial device 100 components and assemblies. Any of the aerial device 100 components or assemblies may also be made of a dielectric or insulative material.

In some embodiments, the dielectric material coat may become damaged, worn, or may not cover the boom assembly 104 or utility platform assembly 106 entirely creating exposed sections of the aerial device 100. The exposed sections may come into contact with highly-charged components on the utility pole assembly 108 such as for example, the three-phase power lines 128, phase 130, transformer 124, or any other component that may have exposed highly-charged components.

The electrical power source that supplies the power to the aerial device 100 through the electrical contact may be any power source. In some exemplary embodiments as discussed above, the utility pole assembly 108 is the power source. The utility pole assembly 108 may be any wood, metal, or composite structure comprising the above described components for supplying and distributing electrical power. Examples used herein include single phase or three-phase power lines that may support any amount of electrical potential up to and beyond 500 kilovolts. The voltage in the power lines 128 may be reduced through the transformer 124 for use in buildings, plants, businesses, and homes. The contact detecting circuit and sensor 144 may detect a contact at any of the voltages provided by any stage of the power distribution. The power lines 128 may support either alternating or direct current. Embodiments of the invention herein include systems and methods for detecting alternating current.

Contact between the boom assembly 104 and the highly-charged components of the utility pole assembly 108 may cause damage to the boom assembly 104. The damage may be minimal and may not compromise the integrity of the boom assembly 104, but some contacts may compromise the structure. The sensor 144 may detect a contact directly or indirectly from communication with a circuit and signal the boom assembly operator or any other person on the boom assembly 104 or in close proximity to the boom assembly 104. The sensor 144 may also include a transmitter and receiver for sending the information to a data store and/or a processor to compare the contact information with a history of contact information to determine a severity of the contact. The data may be stored and analyzed in future contact events.

The data from the sensor 144 may be analyzed by a processor on the aerial device 100 or may be sent wirelessly, transmitted over wired communication, or may be sent using fiber-optic communication. The data may be processed at the remote location and information such as for example the severity of the contact may be relayed back to the utility workers via the receiver. This information may also be sent to first responders or to the utility company which employs the workers. Further information such as GPS location, number of workers, information indicative of the workers, and any other information that may be useful to first responders or the utility company may be sent.

In some embodiments of the invention, the sensor 144 is used to detect a contact between the exposed portions of the boom assembly 104 or utility platform assembly 106 and the highly-charged portions of the utility pole assembly 108. The sensor 144 may be disposed in an insulated location and may be electrically connected to the exposed area through electrical connectors such as wires, clips, ties, bolts, screws, or any other type of attachment that is electrically conductive, or disposed on the exposed area of the boom assembly 104 or utility platform assembly 106 directly.

In some embodiments, the sensor 144 is electrically connected to any portion of the aerial vehicle 100 that my come into contact with the highly-charged portion of the utility pole assembly 108 or any other object that may be electrically charged and may come into contact with any portion of the aerial vehicle 100. Alternatively, the sensor 144 may be electrically connected to areas of the aerial vehicle 100 that may have a high probability of contact with the highly-charged components. These areas may be the boom assembly 104 and the utility platform assembly 106 as depicted in FIGS. 1A-B. The areas may also be particular locations on the boom assembly 104 and the utility platform assembly 106 that may have a high probability of contact with respect to other areas of the aerial device 100 such as the outer surface of the utility platform assembly 106 and the upper portion of the boom assembly 104. The sensor 144 may also be electrically connected to all exposed areas or an exposed area with a high probability of contact relative to other exposed areas.

In some embodiments, the sensor 144 comprises a contact detecting circuit such as a resistor-inductor-capacitor (RLC), inductor-capacitor (LC), resistor-capacitor (RC), or an inductor-resistor (LR) circuit. In some embodiments, there is one circuit electrically connected to one or more areas of a component or multiple components. The areas may be exposed (not dielectrically insulated) areas or areas that may allow for one circuit to be utilized and in electrical contact with multiple exposed areas. Alternatively, there may be one or more circuits connected to or disposed in multiple areas. The one or more circuits may be connected to one sensor such as a high-impedance voltmeter or data store or multiple sensors in multiple areas. There may be one sensor such as the voltmeter per circuit or multiple sensors per circuit. The sensor may receive the circuit output and convert the output to data as needed for storage and analysis.

In some embodiments, the one or more circuits may be connected to one or more sensors that may receive data output from the circuit and store or transmit the data to a data store on the aerial device 100 or a remote location. The sensors may be disposed within the circuit or located anywhere on the aerial vehicle 100 or at a remote location. The circuit and/or sensor may be equipped with a transmitter or transmitters for transmitting data. The data may be sent via wire or wireless and may be stored at a local or remote location. The signal may trigger an alarm at the aerial device 100 or other local location or at a remote location such as at a company head office or maintenance facility, or at a first responder location such as a fire department, police department, or hospital.

In the event that an electrically conductive component of the aerial device 100 contacts a highly-charged component, such as the phase 130 carrying alternating current, the potential of the electrically conductive component follows the alternating potential of the phase 130. The potential of the electrically conductive component follows the alternating potential by charged particles, usually electrons, passing between the phase 130 and the component. This may be exemplified by a voltage passing between the electrically conductive component and the phase 130 with no place to go (i.e. no ground).

Detection of the voltage passing between the boom assembly 104 component and the phase 130 may be achieved by resonating the frequency of the voltage in the circuit 144 and comparing a shifted phase of the voltage to a reference phase that may be the shifted or not shifted. The shifted phases may induce a voltage on a voltmeter indicating that a contact has occurred. For example, a probe (not shown) may be connected to the utility platform assembly 106. The probe may be connected to the circuit 144 and the circuit 144 conducts the voltage on two legs of the circuit 144. The phase of the voltage on a first leg of the circuit 144 is shifted relative to the phase on the second leg of the circuit 144. The difference in the phase shifts induces a detectible voltage on the voltmeter indicative of the contact. If a voltage is not detected then a contact has not occurred. If a voltage is detected then a voltage has been imparted onto the system therefore a contact has occurred.

The duration of the contact may also be measured. Information indicative of the contact such as phase difference, peak-to-peak frequency difference, length of contact, and amplitude or power level of the contact. Though in the case of the phase 144 contact the power should be known, in certain embodiments the contact may be other components that may not be known or the use case may be different such that the power is not known.

Figure 2:
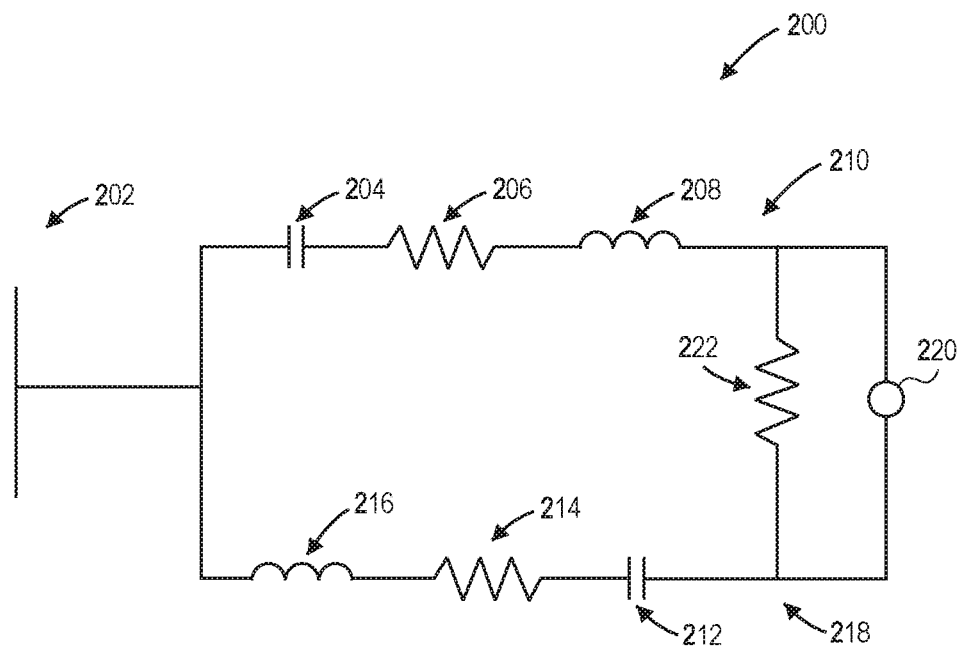
FIG. 2 depicts an exemplary Resistor-Inductor-Capacitor (RLC) circuit in some embodiments of the invention.

One type circuit, represented by the exemplary illustration in FIG. 2, that is used in some embodiments of the invention is a resistor-inductor-capacitor (RLC) circuit 200. In embodiments, the RLC circuit 200 is the general contact detecting sensor 144. In other embodiments, the circuit comprises sensor 144. The RLC circuit 200 can be used to detect a contact between, for example, the phase 130 and the utility platform assembly 106. When the contact occurs the potential in the utility platform assembly 106 and the phase 130 resonate as described above. The RLC circuit 200 may be connected to a conductive portion of the utility platform assembly 106 symbolized by the voltage source 202 and can produce a "ringing" when the phase 130 and the utility platform assembly 106 contact at a known frequency associated with the alternating current of the phase 130 and the tuned frequency of the RLC circuit 200. The alternating current of the phase 130 induces a voltage on the utility platform assembly 106 as described above. The "ringing" may be compounded in the RLC circuit 200 as the alternating current acts on the utility platform assembly 106.

Continuing with the first embodiment, the RLC circuit 200 includes a first capacitor 204, a first resistor 206, and a first inductor 208 on a first leg 210 of the circuit and a second capacitor 212, a second resistor 214, and a second inductor 216 on a second leg 218 of the RLC circuit 200. As FIG. 2 is a representation of the circuit, the resistors in the RLC circuit may be added to the circuit as shown or the resistance may be inherent in the components. In reality, the capacitors and the inductors may provide inherent resistance such that additional resistors are not needed. Any combination of the components may be present in embodiments of the invention. For example, if the impedance in the high-impedance voltmeter 220 is high enough the capacitance/inductance inherent in the conductors or circuitry may be sufficient without including the capacitors and inductors in the circuit. The resistors, inductors, and capacitors may be passive components used to shift the phase of the received electrical potential. The RLC circuit 200 also may be tunable such that the RLC circuit 200 may be tuned to the frequency of the alternating current induced by the phase 130. The circuit includes a measuring device or system such as a high-impedance voltmeter 220 and a resistor 222. Resistor 222 may be used to adjust response time vs sensitivity.

The arrangement of the RLC circuit 200 and the contact, or electric source 202, may trigger a resonance or oscillation of the known source 202 frequency. Current may travel down the first leg 210 of the RLC circuit 200 and back and current may travel up the second leg 218 and back simultaneously. The current may travel back and forth with no place to go since the system is stand alone and not grounded. The first leg 210 and the second leg 218 may have the same frequency but be out of phase due to the phase shifting allowing a voltage to be detected between the first leg 210 and the second leg 218.

In some embodiments, the voltmeter 220 is a high-impedance measuring device capable of measuring high voltage at low currents. Extremely low current rates may be present such that a high-impedance measuring device is necessary for measuring the voltage. In some embodiments, the RLC circuit is an LC circuit and additional resistors are not needed to perform the functions described above.

Figure 3:
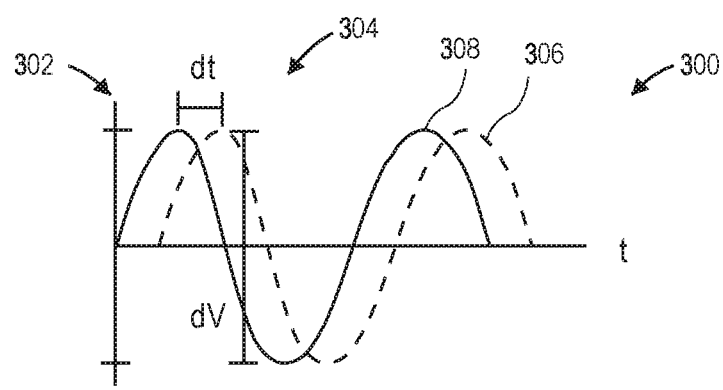
FIG. 3 depicts a voltage measurement from the exemplary RLC circuit of FIG. 2.

Turning now to an exemplary measurement of an embodiment depicted in FIG. 3 presenting a voltage measurement 300 of the RLC circuit 200. The passive components (i.e. first capacitor 204, first resistor 206, and first inductor 208) may be used to shift the phase from the source 302 causing a phase difference from the signal on the first leg 210 and a signal on the second leg 218. The RLC circuit 200 may cause a time difference 304 of the phase shifted measurement 306 as compared to the non-phase-shifted measurement 308 or the phase-shifted measurements may both be shifted but shifted by different amounts. The voltage may be measured at two separate locations by two separate probes or may be measured by one probe supplying the voltage to both legs of the RLC circuit 200. During a contact a charge is taken by the probe and supplied to the first leg 210 and the second leg 218 of the RLC circuit 200 and shifted to provide a phase difference of the voltage on each of the legs. The time difference 304 between portions of the phase (such as the peaks) shifted wave functions induces a voltage that indicates that a voltage is applied to the circuit. This voltage is measured at the voltmeter and is indicative of a voltage being applied at the utility platform assembly 106.

In some embodiment as depicted in FIGS. 4A-D different types of circuits referred to generally by the number 400 are used to detect the contact. In some embodiments, the general circuit 400 is the contact detecting circuit 144 and/or the RLC circuit 200. For example, in FIG. 4A a resistor-capacitor (RC) circuit 402 is used to detect the contact. The RC circuit 402 is a circuit consisting of a resistor 404 and a capacitor 406 connected in series with a measuring device 408. The measuring device 408 may be a high-impedance voltmeter. The RC circuit 402 may not provide a resonance as provided by the RLC circuit 200 of the previously-described embodiment. The RC circuit 402 may provide high-sensitivity measurements and be capable of detecting small changes. The RC circuit 402 may be used for alternating current but may also provide increased functionality in that it may be used to detect a contact with a power source 410. The power source may be direct or alternating current and may be a component of the aerial device 100 in contact with a highly-charged component of the utility pole assembly 108. In the RC circuit 402 the resistance is large and the capacitance is large. A second resistor may be included on lead (or probe) 412 and is optional and may be tuned to provide better performance of the RC circuit 402 and a more accurate and clean output signal.

Figure 4A:
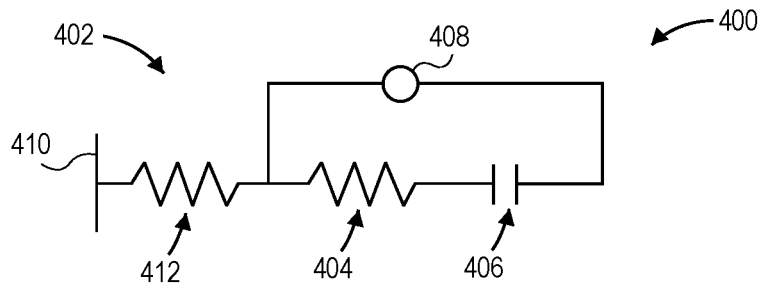
FIGS. 4A-D depict exemplary circuits for use in certain embodiments of the invention.
Figure 4B:
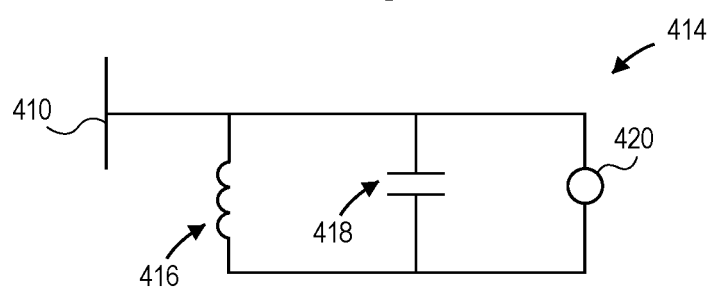

In an alternative embodiment as depicted in FIG. 4B, a simple inductor-capacitor (LC) circuit 414 is presented. The simple LC circuit 414 includes an inductor 416 and a capacitor 418. The simple LC circuit 414 may resonate at the simple LC circuit 414 resonating frequency tuned to the frequency of the expected power source 410. In this embodiment, the expected power source 410 and contact may be the phase 130 of the utility pole assembly 108. The frequency of the phase 130 may be known and the simple LC circuit 414 can be tuned to that frequency to detect the contact between the utility platform assembly 106 which the simple LC circuit 414 may be connected to and the phase 130. The inductor 416 and capacitor 418 are tuned simultaneously. A high-impedance voltage sensor 420 may be used to detect the phase shifted voltage difference between two probe measurements in the circuit as described above.

Figure 4C:
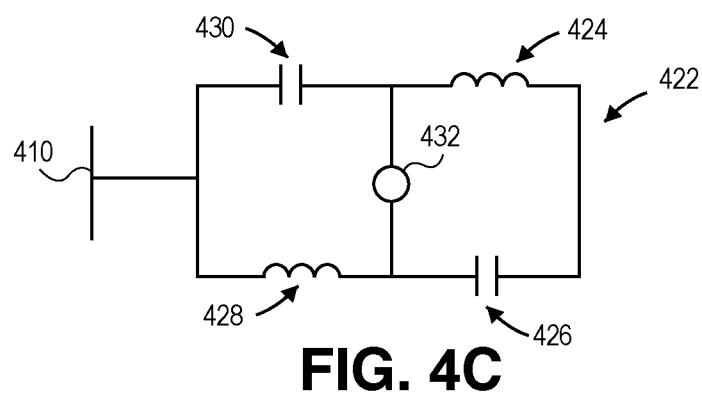

In yet another embodiment as depicted in FIG. 4C, a dual inductor-capacitor (LC) circuit 422 is presented. The dual LC circuit 422 comprises a first inductor 424 and a first capacitor 426 and a second inductor 428 and a second capacitor 430 with a measuring device 432 as depicted in FIG. 4C. The dual LC circuit 422 has similar characteristics to the RLC circuit 200 presented in FIG. 2 and may also resonate at the source frequency provided by the voltage source 410 connected by lead 412. The inductors and capacitors are tuned together.

Figure 4D:
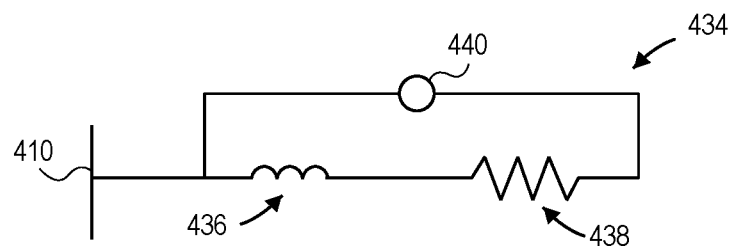

In still another embodiment as depicted in FIG. 4D, a simple LR circuit 434 is presented. The LR circuit 434 includes an inductor 436 and a resistor 438 connected in series with a measuring device 440 such as a voltmeter as depicted in FIG. 4D. The LR circuit 434 may be used when sensitivity is not an issue. In some embodiments, the resistance in LR circuit 434 is small and the inductance is relatively large and the voltage is provided by the power source 410 connected by lead 412.

In some embodiments, the output from the circuit 400 may be stored at a data store associated with the circuit 400. A sensor detecting the circuit 400 output and storing the data may be located at the same location as the circuit 400. Alternatively, the sensor may send the data to a central storage of the aerial device 100 that may contain other operating information and data relevant to the aerial device 100. The data output stored at the aerial device 100 may be accessed at a later time such as after a shift or during routine maintenance.

In some embodiments, in the event of a contact, it may be routine to check the data to determine if a contact had occurred and analyze the data. Based on the data analysis an inspection of the aerial device 100 may be needed. The data may indicate that the contact was severe enough to warrant a full or partial inspection of the contact area. If the data shows that the contact was severe enough the dielectric material may be removed and an inspection of the aerial device 100 or the possibly compromised components may be performed.

Analysis of the data over time may produce a trend and a severity of contact may be determined such that a contact may or may not be severe enough to warrant an inspection. For example, a contact may last for fractions of a second. The data collected on this contact is compared to data collected over time and it is determined that there is an extremely high likelihood that the contact caused no major damage. The aerial device 100 may be allowed to continue in operation without an inspection. Alternatively, the data may indicate that an inspection is warranted and the dielectric material removed and an inspection performed. The inspection results may be logged along with the contact data and the data is added to the analysis for future contact severity analysis. The data and the severity of contact may be categorized for determining the levels of contact such as, for example, minor, moderate, and severe.

In some embodiments, the data is continually monitored. The data may be continually monitored at the aerial device by operators in the utility platform assembly 106, on the aerial device 100, in the structural base 102, or on the ground. A monitor, alarms, or any such indicator may be located at any place on the aerial device 100 that may warn an operator that a contact has occurred.

In the event that a contact is detected the operators may be notified and the aerial device 100, or components of the aerial device 100 such as the boom assembly 104 or the utility platform assembly 106 may be automatically or manually shut down or power may be automatically or manually turned off or reduced. The operation of the aerial device 100 or any component of the aerial device 100 may be automatic or may be handed over to an operator on the ground or at a remote location.

The notification of the contact may be an alarm, a text, a call, or any other wired or wireless communication and may be sent directly to any part of the aerial device 100 or to a remote location. The notification may be sent to the company headquarters or a local hub. The notification may be sent to a first responder location such as a fire department, hospital, or police station.

In some embodiments, the aerial device 100 senses the location of the contact and automatically moves the components in contact away from the contact. Alternatively, the location of the contact may be sent to a remote location where an operator manually takes over and moves the aerial device or components of the aerial device away from the contact.

Figure 5:
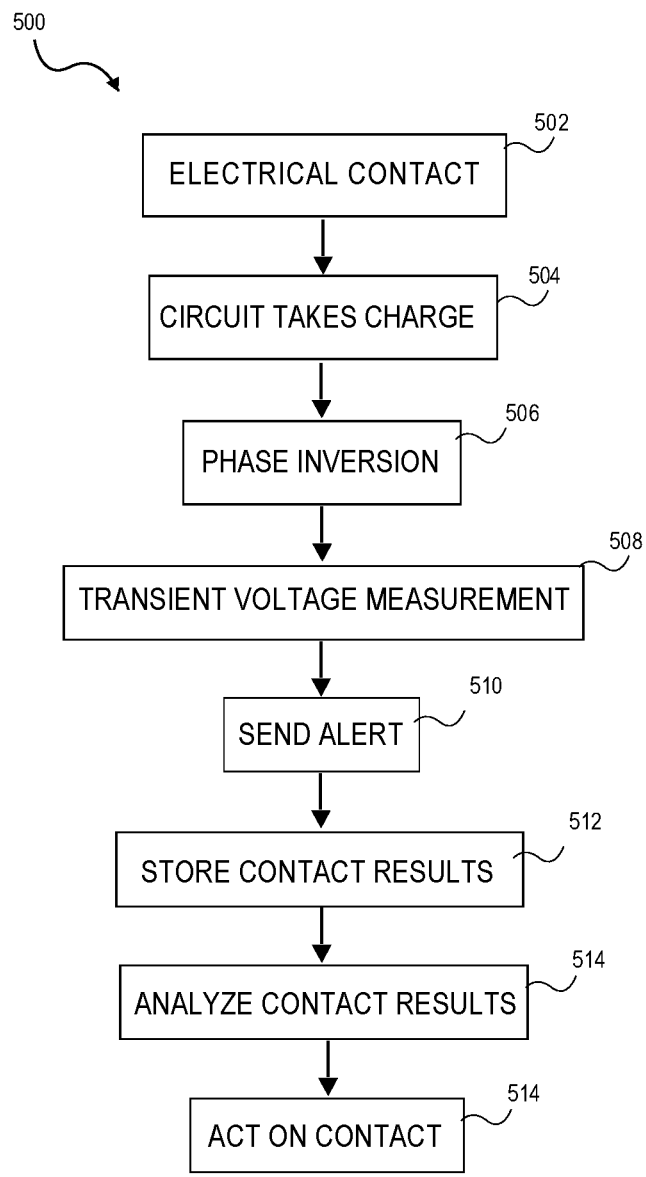
FIG. 5 depicts a flow chart representative of methods from some embodiments of the invention.

A method of a certain embodiment of the invention includes a contact detecting method described in the following steps presented in FIG. 5 and generally referred to by the reference numeral 500. At step 502, the conductive portion of an aerial device 100 contacts a charged component of a utility pole assembly 108 taking the charge at the frequency of the alternating current of the utility pole component. The voltage is applied from the utility pole assembly 108 to the aerial device 100 component in contact and comprising the contact detecting circuit 144.

At step 504, the circuit, in electrical contact with the aerial device 100, takes the charge of the aerial device 100. The circuit 144 alters the voltage phase imparted to the circuit 144 such that the phase change induces a voltage that may be detected by a high-impedance voltage measuring device. A plurality of probes, a plurality of circuits, and a plurality of sensors may be used for measurement of the voltage at a plurality of locations on the same or on different components affected by the contact. The current, with no outlet (e.g. ground) oscillates back and forth on the circuit 144. In some embodiments, the circuit 144 may comprise one, two, or more than two legs for shifting the phase on a first leg relative a second or more legs inducing a detectible voltage as described above. In some embodiments, the circuit may be parallel or series.

At step 506, the passive components (e.g. the resistors, capacitors, and inductors) shift the phase of the voltage on the circuit 144. The passive components are not restricted to resistors, capacitors, and inductors and in some embodiments any combination of the passive components may be used to produce different results.

At step 508, the phase shift is created between the different legs of the circuit creating a measurable voltage that is indicative that a contact has occurred. A measurement of a voltage induced by the phase shift is also indicative of the contact. The duration of contact may also be measured and recorded. The phase shift measurement may be a measure the voltage induced by shifting the phase on each leg of the circuit. The phase of the voltage on one leg may be shifted, or altered, such that the phase of the voltage on another leg that is un-shifted, unaltered, or shifted by a different amount may be used as a reference to induce a voltage measurement.

At step 510, an alert may be sent indicating that a contact has occurred. The alert may be any audible or visual signal on the aerial device 100 to notify the workers of the contact. The alert may also be a signal sent to a remote location. The alert may be sent to the company regional location or may be sent to any emergency unit or 911 dispatch. The alert may be indicative of any information related to the contact such as the severity of the contact, the magnitude of the contact, the location of the contact, or the duration of the contact.

At step 512, the results are stored in a database. The measurement may be stored locally at the aerial device 100 or at a remote location and may be sent wirelessly. The measurement may set off an alarm locally to warn workers of a contact or may be sent remotely to a utility company headquarters, hospital, fire department, or any other remote location that may be alerted to the situation.

At step 514, the results are analyzed for future prediction. The measurement may be analyzed along with the damage to the contacted component of the aerial device 100 to determine the extent of the damage. The damage may be associated with the information provided by the contact measurement to create a model for predicting damage to the components using known, historical, contact information.

At step 516, the analyzed results may be used in future contact to detect the severity of a contact. The recorded contact may be compared to the past contact information and determined to be above or below established thresholds. Certain thresholds may be applied to measured parameters such as length of contact or location of contact. In the event that the measurements are above the thresholds the aerial device 100 may be issued further maintenance or inspection. The results of the maintenance and inspection may be recorded along with the contact and the historical contact information updated.

Though the method described above utilizes an RLC circuit any of the above-described circuits may be used. Two legs including conductors and inductors with an inherent resistance may be used and may also include any combination of the passive components described herein.

Though in some embodiments described above the circuits are used in detecting alternating current, any of the above-mentioned circuits may be used or modified to be used in detecting direct current. For example, the RC circuit of FIG. 4A may be used to detect direct current contacts without modification.

The insulating components and methods of use of the circuits and the components comprising the circuits provided herein may be used individually or in any combination. The components and methods may also be used with other items and methods such as insulating boom covers. These methods may provide layers of security for operators when used in combination significantly decreasing the potential for injury due to electric shock.

It should be appreciated that, while the above disclosure has been generally directed to the field of aerial devices, embodiments of the invention may be directed to other fields and uses. For example, embodiments of the invention may be used in stationary cranes, antennas, digger derricks, and other equipment that may come into contact or used in close proximity to high-voltage electrically charged components.

Although the invention has been described with reference to the embodiments illustrated in the attached drawing figures, it is noted that equivalents may be employed and substitutions made herein without departing from the scope of the invention as recited in the claims.

Having thus described various embodiments of the invention, what is claimed as new and desired to be protected by Letters Patent includes the following:

1. A system for detecting a contact between a boom assembly and an electrical source, the system comprising:
   a circuit electrically connected to the boom assembly;
   a probe for conducting an electric potential from the boom assembly onto the circuit;
   wherein the circuit comprises a first leg and a second leg;
   wherein the first leg is configured to alter the electric potential on the first leg relative to the electric potential on the second leg;
   wherein a difference between the electric potential on first leg and electric potential on second leg induces a voltage on a voltmeter; and
   wherein the induced voltage is indicative of the contact between the boom assembly and the electrical source.

2. The system of claim 1, further comprising a data store for storing data indicative of the contact.

3. The system of claim 2, further configured to transmit the data indicative of the contact.

4. The system of claim 2, wherein the data indicative of the contact includes the magnitude and a duration of the contact.

5. The system of claim 4,
wherein a notification indicative of the contact is transmitted to a remote location, and
wherein the notification includes information indicative of a location of the system.

6. The system of claim 1, wherein the circuit is configured to resonate at a frequency associated with a phase of the first electric potential.

7. The system of claim 1, wherein the first leg is configured with a plurality of components including at least one inductor and at least one capacitor.

8. The system of claim 7,
wherein the first leg includes at least a first inductor and a first capacitor and a second leg includes at least a second inductor, and a second capacitor,
wherein current travels in a first direction on the first leg and concurrently in a second direction on the second leg, and
wherein the current subsequently travels in the second direction on the first leg and in the first direction on the second leg.

9. The system of claim 1, wherein a notification of the contact is presented to an operator of the boom assembly.

10. A system for detecting a contact between a boom assembly and an electrical source, the system comprising:
a circuit electrically connected to the boom assembly via a probe,
wherein the probe conducts an electric potential from the boom assembly onto the circuit,
wherein the circuit comprises a plurality of components for altering the electrical potential received from the probe; and
a sensor for detecting a voltage associated with the altered electric potential,
wherein the detected voltage is indicative of the contact between the boom assembly and the electrical source.

11. The system of claim 10, wherein the electrical source conducts direct current.

12. The system of claim 11, wherein the circuit is a resistor-capacitor circuit.

13. The system of claim 10, wherein the electrical source conducts alternating current.

14. The system of claim 13,
wherein the circuit comprises a first leg comprising a first inductor and a first capacitor and a second leg comprising a second inductor and a second capacitor,
wherein current travels in a first direction on the first leg and concurrently in a second direction on the second leg, and
wherein the current subsequently travels in the second direction on the first leg and in the first direction on the second leg.

15. The system of claim 10,
wherein a phase of the electric potential is altered by shifting the phase on at least one leg of the circuit; and
wherein the phase is shifted by the plurality of components.

16. The system of claim 10, wherein the circuit is one of a group including a resistor-capacitor circuit, an inductor-capacitor circuit, and an inductor-resistor circuit.

17. A method for detecting a contact between a boom assembly and an electrical source, the method comprising the steps of:
conducting an electric potential from the electric source onto the boom assembly by way of the contact between the boom assembly and the electrical source;
conducting the electric potential from the boom assembly onto a circuit electrically connected to the boom assembly,
wherein the electric potential is conducted onto a first leg and a second leg of the circuit;
altering the electric potential on the first leg using passive components; and
detecting, via a voltmeter, a voltage induced by a difference in the electric potential on the first leg and the electric potential on the second leg,
wherein the detected voltage is indicative of the contact between the boom assembly and the electrical source.

18. The method of claim 17, further comprising the steps of:
storing data indicative of the detected voltage;
comparing the data to a history of stored data via a processor; and
sending a notification indicative of the contact.

19. The method of claim 17, wherein the passive components are selected from a group including a resistor-inductor-capacitor circuit, a resistor-capacitor circuit, an inductor-capacitor circuit, and an inductor-resistor circuit.

20. The method of claim 17,
wherein the difference between the first leg and the second leg is indicative of a phase shift, and
wherein the electric potential on the first leg and the electric potential on the second leg are the same prior to altering the electric potential on the first leg.

* * * * *